United States Patent [19]

Yerman

[11] 4,040,874
[45] Aug. 9, 1977

[54] SEMICONDUCTOR ELEMENT HAVING A POLYMERIC PROTECTIVE COATING AND GLASS COATING OVERLAY

[75] Inventor: Alexander J. Yerman, Scotia, N.Y.

[73] Assignee: General Electric Company, Schenectady, N.Y.

[21] Appl. No.: 757,887

[22] Filed: Jan. 10, 1977

Related U.S. Application Data

[63] Continuation-in-part of Ser. No. 601,839, Aug. 4, 1975, Pat. No. 4,017,340.

[51] Int. Cl.² .................................................. H01L 29/28
[52] U.S. Cl. ...................................... 148/33.3; 148/33; 148/187; 29/588; 357/39; 427/93
[58] Field of Search ................. 148/33.3, 33, 187; 29/588; 357/39; 427/93

[56] References Cited

U.S. PATENT DOCUMENTS

| | | | |
|---|---|---|---|
| 3,160,520 | 12/1964 | Jantsch et al. | 148/33.3 |
| 3,316,465 | 4/1967 | Von Bernuth et al. | 148/33.3 |
| 3,343,049 | 9/1967 | Miller et al. | 148/187 X |
| 3,415,680 | 12/1968 | Perri et al. | 148/187 X |
| 3,447,975 | 6/1969 | Bilo et al. | 148/33.3 |
| 3,481,781 | 12/1969 | Kern | 148/187 |
| 3,615,913 | 10/1971 | Shaw | 357/52 X |
| 3,806,371 | 4/1974 | Barone | 148/187 X |
| 3,917,495 | 11/1975 | Horn | 148/33.3 X |

Primary Examiner—G. Ozaki
Attorney, Agent, or Firm—Donald M. Winegar; Joseph T. Cohen; Jerome C. Squillaro

[57] ABSTRACT

A multilayer passivation-encapsulation for a semiconductor element is provided by a suitable polymer layer disposed on the device and overcoated with a glass layer for hermeticity.

26 Claims, 2 Drawing Figures

SEMICONDUCTOR ELEMENT HAVING A POLYMERIC PROTECTIVE COATING AND GLASS COATING OVERLAY

CROSS-REFERENCE TO RELATED PATENT APPLICATION

This patent application is a continuation-in-part of my co-pending patent application Ser. No. 601,839, filed on Aug. 4, 1975, now U.S. Pat. No. 4,017,340, and assigned to the same assignee as this application.

BACKGROUND OF THE INVENTION

1. Field of the Invention

This invention relates to protective coating materials for semiconductor elements.

2. Description of the Prior Art

Heretofore, some prior art methods provide coating at least preselected exposed surface areas of semiconductor elements with electrically insulating oxide materials. Such coatings are thin layers and have virtually no resistance to mechanical abrasion and require relatively expensive processing equipment. In almost all instances a second and a thicker coat of a protective coating material is provided to protect the initial electrically insulating material. Silicone greases, varnishes, rubbers and resins which are employed as the overcoating of protective material have been found lacking in desirable physical characteristics.

Robert R. Shaw in U.S. Pat. No. 3,615,913, granted on Oct. 26, 1971, teaches the employment of a coating of a cured, protective coating material selected from the group consisting of polyimides, and polyamide-polyimides disposed on exposed end portions of at least one P-N junction to provide passivation thereof. Although these materials exhibited good abrasion resistance properties, the passivation requirements of the semiconductor element still required improvements to be made thereto.

There is currently wide sread use of oxide/glass layers for passivation and encapsulation of semiconductor devices where device stability and long life are important considerations. However, if the glassy layer must be applied after aluminum metallization, (a wide spread requirement), the choice of suitable glass systems is severely circumscribed by a maximum permissible application temperature of ~ 577° C. This restriction is set by the alumina-silicon eutectic and must be carefully observed in all processing operations following aluminization of the silicon.

Several glass coating methods are currently in use. These include chemical vapor deposition (CVD), glass frits, and spin-on glass forming alcoholates. The last method is only capable of forming very thin layers, of the order of 2000A, of glasses which tend to be more reactive than desirable and, therefore, are of restricted utility in packaging. Glass frits are widely used in packaging but are not usually employed for surface passivation because of difficulties in formulating glasses with an adequate expansion match to silicon, and which are at the same time suitable passivants and chemically stable. CVD methods permit adequate thickness, a wide choice of composition, expansion matching, etc. but difficulties in controlling sodium contamination in CVD reactors have made it difficult to obtain acceptable passivation layers by direct deposition onto bare silicon. This method is, therefore, usually restricted to use as an overcoating of $SiO_2$ and metallization layers.

None of these methods in their current state of development is considered capable of providing a reliable passivation/encapsulation method for large thyristors and other power semiconductor devices.

The processing of such devices usually requires surface passivation of bare silicon p-n junctions with aluminum contacts already in place on the silicon. Thus the above-mentioned temperature restrictions on processing apply. Additionally, however, one must concern oneself with the surface charge of the passivation layer when it is directly applied to bare silicon. Such charge can be fixed and positive as in the case of a clean grown thermal oxide, or mobile, e.g., when due to the presence of sodium ion contamination of the oxide. Certain proprietary glass compositions give a negative fixed charge when applied to silicon.

Within limits, on some devices, an appropriate surface charge can be beneficial. For example, in the case of a P+N diode under reverse bias conditions, a negative surface charge will tend to deplete the surface of the n-type material, spread the depletion layer near the surface and hence lower surface electric field thus suppressing surface breakdown. On a P N+ diode, positive surface charge could have a similar beneficial effect if certain limits are not exceeded. Too much surface charge can cause surface inversion and channeling with a concommittant increase in surface leakage which is intolerable.

In many power devices, e.g., such as high voltage D.C. thyristors, the edges of the device are tapered or beveled in order to reduce surface fields and suppress surface breakdown. Since such devices are designed to block in both forward or reverse directions when not turned on by the control gate, one encounters the situation that on alternate half cycles maximum surface fields can exist on either side of lightly doped p-n junctions comprising the device and any surface charge will be deleterious favoring surface breakdown in either forward or reverse blocking conditions.

In such cases the most favorable surface coating is one which is charge neutral or nearly so. Currently, there are no known passivation coatings involving glasses or silicon oxides capable of giving such a desired charge neutral surface.

In the co-pending patent application it was my belief that a polyimide-silicone copolymer material, overlaid with a chemical vapor deposited glass layer was most desirable. However, it has been discovered that in some instances the silicone material need not be present.

Therefore, it is an object of this invention to provide a new and improved passivation process for semiconductor elements which overcomes the deficiencies of the prior art.

An object of this invention is to provide a semiconductor element having a passivation coating embodying at least one glass layer overcoating a polyimide polymer or a polyimide-silicone copolymer material layer.

Other objects of this invention will, in part, be obvious and will, in part, appear hereinafter.

SUMMARY OF THE INVENTION

In accordance with the teachings of this invention, there is provided a new and improved semiconductor element comprising a body of semiconductor material having at least two regions of opposite type conductivity. A P-N junction is disposed between, and formed by the abutting surfaces of, each pair of regions of opposite type conductivity. An end portion of at least one P-N junction is exposed at a surface of the body. A layer of a protective coating material is disposed on a selected area of the body including the at least one exposed P-N junction thereat. The material of the protective coating layer adheres to the surface of the body, has excellent abrasion resistance and is capable of withstanding selected elevated temperature excursions for a period of time. The material is substantially free of outgassing during the temperature excursion and has a desirable glass transition temperature. At least one layer of a glass-like material is deposited on the protective coating material. The glass material has good adhesion to the material of the protective coating layer and has a coefficient of thermal expansion well matched with that of the semiconductor material of the body. A second glass layer may be deposited on the first glass layer. The glass material forms a hermetic seal for the surface of the element that it covers. Preferably the glass layers are chemically vapor deposited on the surface.

A layer of borosilicate glass having about 19% boron is suitable for a body of silicon semiconductor material. The protective coating material may be a polyimide, polyimide-polyamide or a polyimide-silicone copolymer, which adheres well to both the silicon and to the borosilicate glass. Such a suitable material is either one of the following:

1. the reaction product of a silicon-free organic diamine and an organic tetracarboxylic dianhydride in a suitable organic solvent which when cured, yields a polymer having recurring structural units of the following formula:

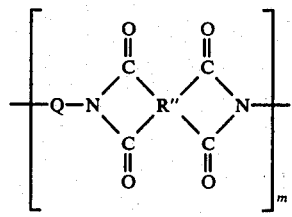

I.

wherein R" is a tetravalent organic radical, Q is a divalent silicon-free organic radical which is the residue of an organic diamine and $m$ is an integer greater than 1 and preferably from 10 to 10,000 or more. 2. the reaction product of a silicon-free organic diamine, an organic tetracarboxylic dianhydride and a polysiloxane diamine, in a suitable organic solvent, which when cured, yields a copolymer having recurring structural units of formula I and with from 5 to 50 mol percent intercondensed structural units of the following formula II:

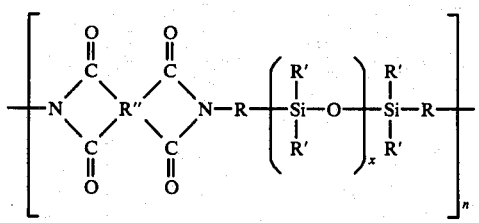

II.

wherein R is a divalent hydrocarbon radical, R' is a monovalent hydrocarbon radical, R" is a tetravalent organic radical, $x$ is a whole number equal to at least 1 and advantageously from 1 to 8 and as high as 1 to 10,000 or more, $n$ is an integer which is the same as, or different from $m$ of formula I and is greater than 1 and preferably from 10 to 10,000 or more. 3. a blend of the polyimide material of Formula I and the polyimide material of Formula II in such molar proportions that the structural units of the latter are within the range of from 5 to 50 mol percent of the units based on the total molar concentration of the units of Formula II and the units of Formula I.

DESCRIPTION OF THE INVENTION

Figure 1:
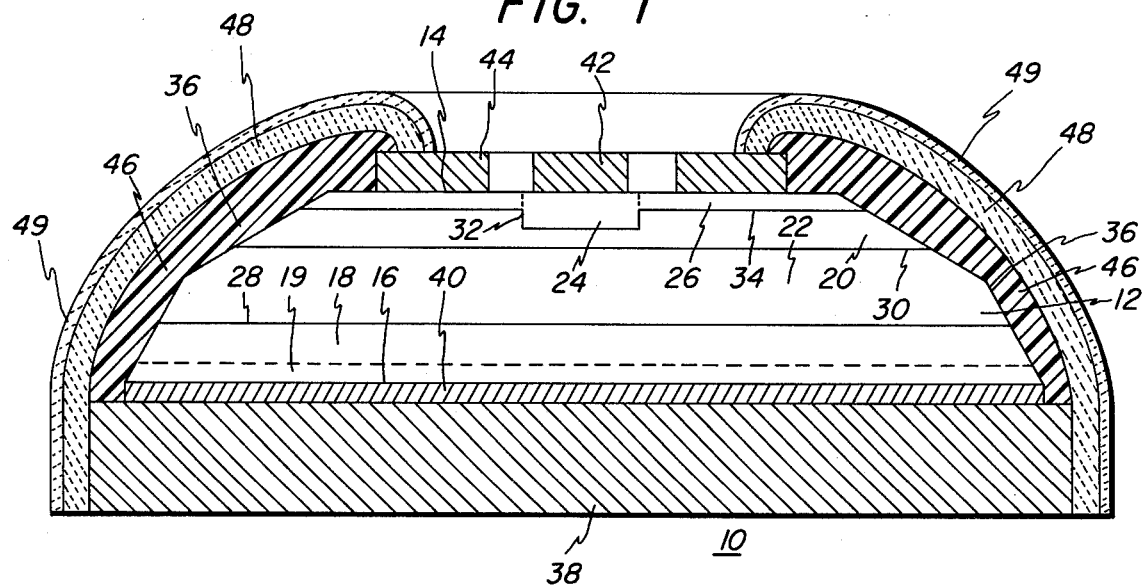
FIGS. 1 and 2 are side elevation views, in cross-section, of semiconductor elements embodying the novel structure of this invention.

With reference to FIG. 1, there is shown a semiconductor element 10 comprised of a body 12 of semiconductor material. The body 12 is prepared by suitable means, such, for example, as by polishing and lapping to parallelism two opposed surfaces 14 and 16. The body 12 has two or more regions of opposite type conductivity and a P-N junction formed by the abutting surfaces of each pair of regions of opposite type conductivity. The end portion of at least one P-N junction is exposed in a surface of the body 12. The body 12 comprises a suitable semiconductor material such, for example, as silicon, silicon carbide, germanium, compounds of Group II and Group VI elements.

In order to more fully describe the invention and for no other purposes, the body 12 will be described as being comprised of silicon semiconductor material having five regions of conductivity and four P-N junctions. Such a configured element 10 may function as a thyristor. Therefore, the body 12 has regions 18 and 20 of P-type conductivity, region 19 of P+-type conductivity and regions 22, 24, and 26 of N-type conductivity. P-N junctions 28, 30, 32 and 34 are formed by the abutting surfaces of the respective pairs of regions 18 and 22, 22 and 20, 20 and 24, and 20 and 26 of opposite type conductivity.

One means of controlling the surface electric field on such a controlled rectifier is to contour the side surface 36 after affixing the partially processed body 12 to a large area contact, or support electrode, 38 by a layer 40 of a suitable ohmic electrical solder. Electrical contacts 42 and 44 are affixed to the respective regions 24 and 26. As illustrated, the contouring of the surface 36 results in the well known double bevel surface.

Figure 2:
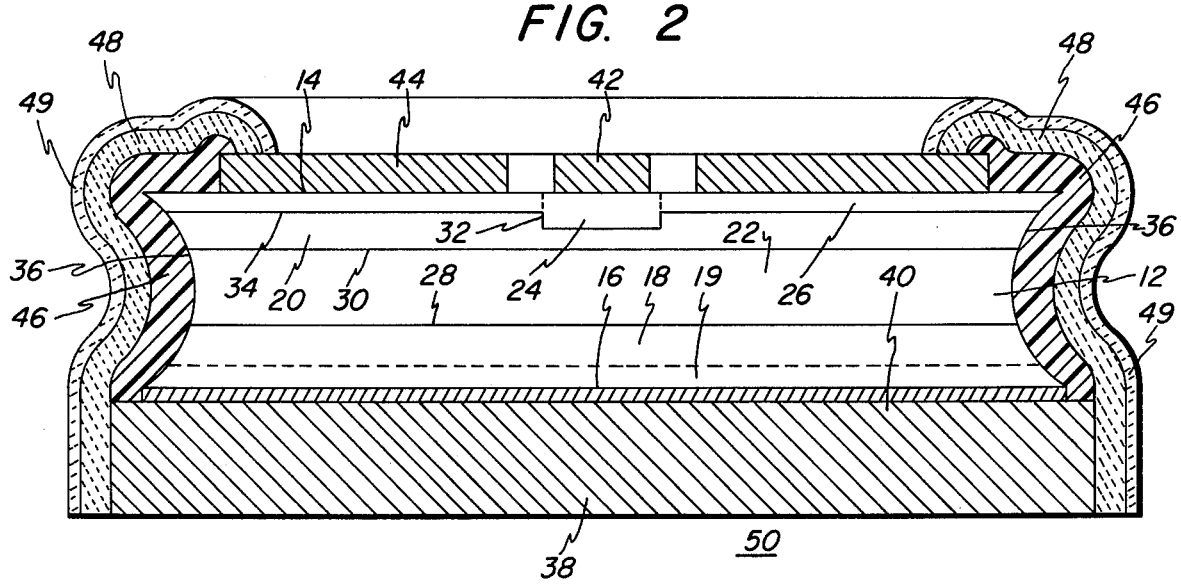

Referring now to FIG. 2, there is shown a semiconductor element 50 embodying a double positive bevel configuration for controlling surface electric field. All items denoted by the same reference numbers as those in element 10 of FIG. 1 are the same, and function in the same manner, as the corresponding item in element 10. The element 50 functions as a thyristor for the configuration illustrated.

Regardless of the method employed to control the surface electric field, selected end portions of at least some of the P-N junctions are exposed at surface areas of the body 12. It is necessary therefore to apply a suitable material to protect the exposed end portions of the P-N junctions.

A layer 46 of a protective coating material is disposed on at least the surface 36 and the exposed end portion of at least the P-N junctions 28 and 30. It is desirable that the material of the layer 46 adhere to the surface 36 as well as to the material of the layer 44 and the contact, or suport electrode 38. The material of the layer 46 must also be capable of withstanding an elevated temperature for periods of time necessary to deposit glass materials by chemical vapor deposition or other techniques upon the layer 46. Such glass materials for the over-layer are CVD deposited glasses, or glass frits and glass applied by spin application. Additionally, the material of the layer 46 must be capable of providing, when cured, an adherent bond between the glass layer and itself and should exhibit good abrasion resistance, as well as resistance to the chemical reagents utilized in completing the fabrication of the element 10. Further, the material comprising the layer 46 must not exhibit any outgassing of the polymer during deposition, or formation, of the glass layer 48. Additionally, the materal of layer 46 should have a low glass transition temperature so as not to cause too great a strain to be retained in the layer 46 which may cause the layer 46 to lift away from the surface 36. A desirable range of glass transition temperature is from about 150° C to 350 ° C, with a preferred value of ~ 200° C.

A protective coating material such, for example, as a polyimide or a polyimide-silicone copolymer, the composition of which is to be described later has been found to be such a desirable material when disposed on at least the surface 36 and the exposed end portion of at least the P-N junctions 28 and 30.

The protective coating material may be disposed on the surface 36 as a polymer precurser dissolved in a suitable solvent. Upon heating, the solvent is evaporated and the protective coating material of the layer 46 is polymerized in situ on the surface 36 and the end portion of at least one P-N junction. Preferably, the material of the layer 46 is applied to the preselected surface area of the surface 36 of the body 12 as a solution of a soluble polymeric intermediate. Application of the material to at least the surface 36 of the body 12 is by such suitable means as spraying, spinning, brushing and the like. The body 12 with the applied protective coating material is then heated to convert the resinous soluble polymer intermediate to a cured, solid, and selectively insoluble material.

One of two suitable materials for comprising the layer 46 and meeting the aforesaid requirements is the reaction product of a silicon-free organic diamine and an organic tetracarboxylic dianhydride in a suitable organic solvent to yield a polymer having recurring structural units of the following formula:

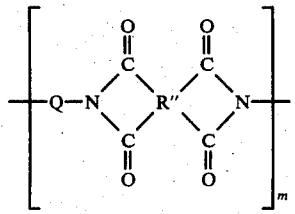

I.

wherein R" is a tetravalent organic radical, Q is a divalent silicon-free organic radical which is the residue of an organic diamine and m is an integer greater than 1 and preferably from 10 to 10,000 or more.

The second of the two suitable materials is the reaction product of a silicon-free organic diamine, an organic tetracarboxylic dianhydride and a polysiloxane diamine, in a suitable organic solvent to yield a copolymer having recurring structural units of formula I and with from 5 to 50 mol percent intercondensed structural units of the following formula II:

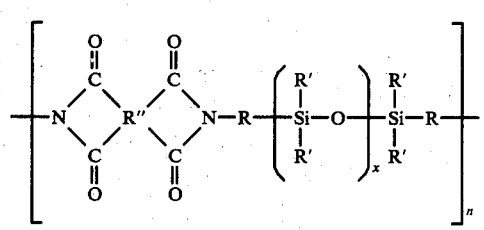

II.

wherein R is a divalent hydrocarbon radical, R' is a monovalent hydrocarbon radical, R" is a tetravalent organic radical, x is a whole number equal to at least 1 and advantageously from 1 to 8 and as high as 1 to 10,000 or more, n is an integer which is the same as, or different from m of formula I and is greater than 1 and preferably from 10 to 10,000 or more.

The above-mentioned polyimide-silicone random or block copolymers can be prepared by effecting reaction, in the proper molar proportions, of a mixture of ingredients comprising a diaminosiloxane of the general formula:

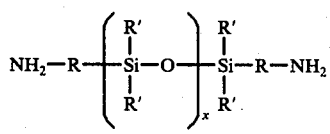

III.

a silicon-free diamino compound of the formula:

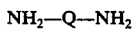

IV.

and a tetracarboxylic acid dianhydride having the formula

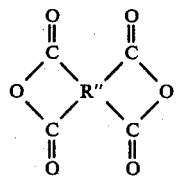

V.

wherein R, R', R", Q and x have the meanings given above.

Alternatively, a polysiloxane-imide composition may be used with comparable effectiveness by blending together a polyimide composed solely of recurring structural units of Formula I with a polyimide composed solely of recurring structural units of Formula II employing the polyimide of Formula II in such a molar proportion that the structural units of the latter are within the range of from 5 to 50 mol percent of said units based on the total molar concentration of the units of Formula II and the units of Formula I.

It will be recognized that the ultimate polyimide siloxane composition used in the practice of this invention will consist essentially of the imido structures found in Formulas I and II. However, the actual precursor materials resulting from the reaction of the diamino-siloxane, the silicon-free organic diamine and the tetracarboxylic acid dianhydride will initially be in the form of a polyamic acid structure composed of structural units of the Formulas:

VI.
$$\left[ \begin{array}{c} Q-N-C \\ | \;\; \| \\ H \;\; O \end{array} \begin{array}{c} O \\ \| \\ R'' \\ HOOC \quad COOH \end{array} \begin{array}{c} C-N \\ \| \;\; | \\ O \;\; H \end{array} \right]_m$$

VII.
$$\left[ R \left\{ \begin{array}{c} R' \\ | \\ Si-O \\ | \\ R' \end{array} \right\}_x \begin{array}{c} R' \\ | \\ Si-R-N-C \\ | \quad\quad | \;\;\| \\ R' \quad\quad H \;\; O \end{array} \begin{array}{c} O \\ \| \\ R'' \\ HOOC \quad COOH \end{array} \begin{array}{c} C-N \\ \|\;\; | \\ O\;\; H \end{array} \right]_n$$

where R, R', R", Q, x, m and n have the meanings given above.

The diamino siloxanes of Formula III which may be used in the practice of the present invention include compounds having the following formulas:

$$N_2H-(CH_2)_3-\underset{\underset{CH_3}{|}}{\overset{\overset{CH_3}{|}}{Si}}-O-\underset{\underset{CH_3}{|}}{\overset{\overset{CH_3}{|}}{Si}}-(CH_2)_3-NH_2;$$

$$H_2N-(CH_2)_4-\underset{\underset{CH_3}{|}}{\overset{\overset{CH_3}{|}}{Si}}-O-\underset{\underset{CH_3}{|}}{\overset{\overset{CH_3}{|}}{Si}}-(CH_2)_4-NH_2;$$

$$H_2N-(CH_2)_3-\underset{\underset{C_6H_5}{|}}{\overset{\overset{C_6H_5}{|}}{Si}}-O-\underset{\underset{C_6H_5}{|}}{\overset{\overset{C_6H_5}{|}}{Si}}-(CH_2)_3-NH_2;$$

$$H_2N-\underset{CH_3}{\underset{|}{\bigcirc}}-\underset{\underset{CH_3}{|}}{\overset{\overset{CH_3}{|}}{Si}}-O-\underset{\underset{CH_3}{|}}{\overset{\overset{CH_3}{|}}{Si}}-\underset{CH_3}{\underset{|}{\bigcirc}}-NH_2;$$

$$H_2N-(CH_2)_3-\left\{\underset{\underset{CH_3}{|}}{\overset{\overset{CH_3}{|}}{Si}}-O\right\}_3-\underset{\underset{CH_3}{|}}{\overset{\overset{CH_3}{|}}{Si}}-(CH_2)_3-NH_2;$$

$$H_2N-(CH_2)_4-\underset{\underset{C_6H_5}{|}}{\overset{\overset{CH_3}{|}}{Si}}-O-\underset{\underset{C_6H_5}{|}}{\overset{\overset{CH_3}{|}}{Si}}-(CH_2)_4-NH_2;$$

$$H_2N-CH_2CH(CH_3)-\underset{\underset{CH_3}{|}}{\overset{\overset{CH_2-CH_2-CN}{|}}{Si}}-O-\underset{\underset{CH_3}{|}}{\overset{\overset{CH_2-CH_2-CN}{|}}{Si}}-CH(CH_3)CH_2-NH_2$$

and the like.

The diamines of Formula IV above are described in the prior art and are to a large extent commercially available materials. Typical of such diamines from which the prepolymer may be prepared are the following:
m-phenylenediamine;
p-phenylenediamine;
4,4'-diaminodiphenylpropane;
4,4'-diaminodiphenylmethane;
4,4'-methylene dianiline;
benzidine;
4,4'-diaminodiphenyl sulfide;
4,4'-diaminodiphenyl sulfone;
4,4'-diaminodiphenyl ether;
1,5-diaminophthalene;
3,3'-dimethylbenzidine;
3,3'-diamethoxybenzidine;
2,4-bis($\beta$amino-t-butyl)toluene;
bis(p-$\beta$amino-t-butylphenyl)ether;
bis(p-$\beta'$-methyl-o-aminopentyl)benzene;
1,3-diamino-4-isopropylbenzene; 1,2-bis(3-aminopropxy)ethane;
m-xylylenediamine;
p-xylylenediamine;
bis(4-aminocyclohexyl)methane;
decamethylendiamine;
3-methylheptamethylenediamine;
4,4-dimethylheptamethylenediamine;
2,11-dodecanediamine;
2,2-dimethylpropylenediamine;
octamethylenediamine;
3-methoxyhexamethylenediamine;
2,5-dimethylhexamethylenediamine;
2,5-dimethylheptamethylenediamine;
3-methylheptamethylenediamine;
5-methylnonamethylenediamine;
1,4-cyclohexanediamine;
1,12-octadecanediamine;
bis(3-aminopropyl)sulfide;
N-methyl-bis(3-aminopropyl)amine;
hexamethylenediamine;
heptamethylenediamine;
nonamethylenediamine;
and mixtures thereof. It should be noted that these diamines are given merely for the purpose of illustration and are not considered to be all inclusive. Other diamines not mentioned will readily be apparent to those skilled in the art.

The tetracarboxylic acid dianhydrides of Formula V may further be defined in that the R" is a tetravalent radical, e.g., a radical derived from or containing an aromatic group containing at least 6 carbon atoms characterized by benzenoid unsaturation, wherein each of the 4 carbonyl groups of the dianhydride are attached to a separate carbon atom in the tetravalent radical, the carbonyl groups being in pairs in which the groups in each pair are attached to adjacent carbon atoms of the R' radical or to carbon atoms in the R' radical at most one carbon atom removed, to provide a 5-membered or 6-membered ring as follows:

$$\begin{array}{c} O \;\;\;\;\;\;\; O \\ \| \;\;\;\;\;\;\; \| \\ C-O-C \\ \| \;\;\;\;\;\;\; \| \\ =C \text{———} C= \end{array} \text{ or } \begin{array}{c} O \;\;\;\;\;\;\; O \\ \| \;\;\;\;\;\;\; \| \\ C-O-C \\ | \;\;\;\;\;\;\; | \\ -C=\!=\!=C- \end{array} \text{ or } \begin{array}{c} O \;\;\;\;\;\;\; O \\ \| \;\;\;\;\;\;\; \| \\ C-O-C \\ \diagup \;\;\;\;\;\;\; \diagdown \\ C=C-C \end{array}$$

Illustrations of dianhydrides suitable for use in the present invention (with their reference designated in parenthesis) include:
pyromellitic dianhydride (PMDA);
2,3,6,7-napthalene tetracarboxylic dianhydride;
3,3',4,4'-diphenyl tetracarboxylic dianhydride;
1,2,5,6-napthalene tetracarboxylic dianhydride;
2,2'3,3'-diphenyl tetracarboxylic dianhydride;

2,2-bis(3,4-dicarboxyphenyl)propanedianhydride;
bis(3,4-dicarboxyphenyl)sulfone dianhydride;
2,2-bis[4-(3,4-dicarboxyphenoxy)phenyl]propane dianhydride (BPA dianhydride);
2,2-bis[4-(2,3-dicarboxyphenoxy)phenyl]propane dianhydride;
benzophenone tetracarboxylic acid dianhydride (BPDA);
perylene-1,2,7,8-tetracarboxylic acid dianhydride;
bis(3,4-dicarboxyphenyl)ether dianhydride, and
bis(3,4-dicarboxyphenyl)methane dianhydride
and aliphatic anhydrides such as cyclopentane tetracarboxylic dianhydride, cyclohexane tetracarboxylic dianhydride, butane tetracarboxylic dianhydrides, etc. The incorporation of other anhydrides, such as trimellitic anhydride, to make amide-imide-siloxane polymers is not precluded.

Application of the random or block copolymers or blends of polymers in a suitable solvent (including, for example, N-methylpyrrolidone, N,N-diamethylacetamide, N,N-dimethylformamide, etc.) alone or combined with nonsolvents, to the substrate material may be by conventional means such as dipping, spraying, painting, spinning, etc. The block or random copolymers or blends of polymers may be dried in an initial heating step at temperatures of about 75° to 125° C for a sufficient time frequently under vacuum to remove the solvent. The polyamic acid is then converted to the corresponding polyimide-siloxane by heating at temperatures of about 150°-300° C for a sufficient time to effect the desired conversion to the polyimide structure and final cure.

A preferred curing cycle for materials of the above general formula is as follows:
 (a) from 15 to 30 minutes of from 135° C to 150° C in dry $N_2$.
 (b) from 15 to 60 minutes at about 185° C ±10° C in dry $N_2$.
 (c) from 1 to 3 hours at about 225° C in vacuum.

Alternately, it has been found that one may be able to cure the coating material in other atmospheres such, for example, as air for ease of commerical application of this invention.

Sufficient material is applied to the surface 36 to provide a layer 46 the thickness of which is from 0.1μm to 100 microns. The minimum thickness is determined by the requirement that the cured material prevent the penetration of glass through the layer 46 to the silicon of the surface 36.

Alternately, one may employ the polymer material of Formula I without the silicone material. It is known that the addition of the silicone material of the general Formula II increases the adhesive properties of the material of layer 46 as well as the corona resistance thereof. However, I have found that sometimes the polyimide material of the general Formula I is sufficient for some device applications. I have found that I can form the glass layer 48 over this polyimide material as well and achieve excellent results. However, in each instance it is preferred that the material of the layer 46 be capable of withstanding about 450° C for up to 20 to 30 minutes, as required, in normal device processing during manufacture.

Other suitable protective coating materials of polyimides, polyamides, polyimide-polyamides, and methods for making the same, all of which may embody polysiloxanes as required, are described further in U.S. Pat. Nos. 3,325,450, 3,553,282, 3,598,784 and 3,740,305 which by reference are made part of the disclosures of the instant application. Additionally, polyimides, polyamides and polyimide-polyamides which will at least adhere to the material of the contacts 44 and 38 and withstand the glass deposition temperature are also suitable for comprising the layer 46. Preferably, any polymer material employed should adhere to the semiconductor material and its metallized areas.

The layer 48 of glass is disposed on the layer 46 by any suitable means known to those skilled in the art. Such suitable means includes the deposition of a glass frit layer of suitable thickness on the layer 46 and thereafter forming the layer 48 by heating to an elevated temperature for a given time. In a similar manner, the glass may be formed by applying the glass on the layer 46 by a spin on technique followed by a subsequent heat treatment. Preferably the layer 48 of glass is deposited on the layer 46 by chemical vapor deposition. The layer 48 has a thickness of from 1μm to about 15μm. In the preferred deposition process, the coated wafers, elements or devices 12 are disposed within a chemical vapor deposition reactor and heated to the glass deposition temperature in an inert atmosphere. An appropriate gas mixture is introduced into the reactor and the layer 48 of glass grown or deposited on the layer 46. Suitable glasses to be vapor deposited are phosphosilicate and borosilicate glasses. For example, a gaseous mixture of diborane, silane and oxygen at a temperature of about 400° C ± 50° C produce a layer 48 of borosilicate glass. A borosilicate glass comprising from 15 to 25 mol percent $B_2O_3$ is desirable. A preferred value for $B_2O_3$ in the glass is 19 ± 2 mol percent. This preferred range of $B_2O_3$ in the glass is desirable to achieve a glass layer 48 the thermal expansion coefficient of which matches that of the silicon body 12 quite well. The glass deposition process is practiced for a sufficient time to provide a thickness of from 1μm to 10μm for the layer 48. A preferred thickness is 3μm.

Alternately a mixture of phosphine, silane and oxygen gases provides a layer 48 of phosphosilicate glass. The temperature of chemical deposition of the same is approximately 325° C – 475° C. Other suitable glass application processes embody the use of glass frits and spin-on glass forming alcholates.

In order to assure better resistance to chemical attack and further reduce moisture permeability the two layers 46 and 28 can be overcoated with a second glass layer 49. The layer 49 preferably is silox or silicon dioxide deposited at a temperature of about 400° C ± 50° C. The process is practiced for a sufficient time to provide a thickness for the layer 49 of from 1000A to 5000A. A preferred thickness is 2000A.

In order to illustrate the teachings of this invention, deposits as described have been applied to single crystal silicon semiconductor material, about 2 inches in diameter in the manner previously described in this specification. A solution of the polymer precurser in the form of the polyamic acid form dissolved in N-methyl-2-pyrrolidone containing 25% solids by weight was disposed on the surface of the silicon wafer.

The polymer precurser solution was formed by reacting benzophenone tetracarboxylic acid dianhydride with methylene dianiline and bis(γ-aminopropyl)tetramethyldisiloxane, the latter two diamine materials being present in the molar ratio of 70:30. The reaction was carried out at a temperature of less than 50° C and using suitably purified and dried materials to favor a large molecular weight polymer.

The protective coating material was cured in three stages of heating. Each coated device or wafer was heated to a temperature of 135° C ± 5° C for 20 minutes in an atmosphere of dry nitrogen gas. At the completion of this process time, the temperature was raised to 185° C ± 5° C and the devices held at temperature in dry nitrogen gas for 30 minutes. Upon completion of this process step, the devices were removed to a vacuum oven and heated to an elevated temperature of about 225° C ± 5° C for from 1 to 3 hours. The devices were removed from the oven and placed on a susceptor in a chemical vapor deposition reactor.

The devices were heated to an elevated temperature of 450° C ± 5° C in an atmosphere of nitrogen. When observed to be at temperature a gas mixture of diborane, silane and oxygen was then introduced into the reactor and caused to flow over the coated devices. The gas flow ratio was as follows:

| | |
|---|---|
| Diborane | 13.5 cc/min, (1.05% in Argon) |
| Silane | .450 cc/min. (5.1% in Argon) |
| Oxygen | >600 cc/min, |

The reaction was continued for about 6 minutes and the diborane gas was turned off but the other gas flows were continued for another two and one half minutes. The reaction process was then stopped and the devices cooled to room temperature in ∼5 minutes.

A visual examination of the devices revealed the glass layers to be of excellent quality. The glass coating was homogeneous and featureless.

The coated devices exhibited excellent resistance to moisture permeability. Additionally, the glass prevented the cured copolymer material from being attacked by the chemicals employed in further processing of the device.

Further examination showed the cured organic copolymer material to adhere tenaciously to both the silicon of the device and to the borosilicate glass deposited thereon. The thickness of the cured copolymer was measured and found to be 3 micrometers. The thickness of the borosilicate layer, when measured, was 4000A and that of the silox layer 2000A.

As illustrated by the above example, the novel device process of this invention provides a possible means of eliminating the presently employed hermetic packages. This is a significant reduction in the overall cost of the device as sold commercially.

Other advances achieved by the novel devices and processing techniques includes a significant reduction in surface charge by use of the polymer passivation film while retaining the barrier properties of glass as the outer hermetic layer. In contrast, glass disposed directly on the silicon surface introduces alkali ions, particularly sodium ions, which are free to contaminate the surface of the device. Because of the high electric field which exist in the vicinity of a p-n junction, the ions move about the surface and cause current leakages which degrade the device. Additionally, the glasses of the protective coatings cause surface charges. These surface charges vary the depletion layer shape near the surface upon which they are dispersed on the devices altering surface electric field which can favor voltage breakdown of the devices at the surface so affected.

Therefore, the use of applicant's novel passivation coating enables one to have a neutral charge coating material on the device surface. Additionally, the coating has excellent adhesion properties relative to both the semiconductor material and the glass disposed on the coating. Chemical vapor deposition of the glass onto the organic copolymer coating is preferred as the composition of the glass can be readily controlled and/or varied during the deposition process.

I claim as my invention:
1. A semiconductor element comprising:
a body of semiconductor material having at least two regions of opposite type conductivity and a P-N junction disposed between, and formed by the abutting surfaces of, each pair of regions of opposite type conductivity;
an end portion of at least one P-N junction exposed at a surface of the body;
a layer of a protective coating material disposed on the exposed end portion of the at least one P-N junction;
the protective coating material is a polymer which is, when cured, one selected from the group consisting of the reaction product of a silicon-free organic diamine and an organic tetracarboxylic dianhydride, a silicon-free organic diamine, an organic tetracarboxylic dianhydride and a polysiloxane diamine and a blend of polyimide compound of recurring structural units of the formula:

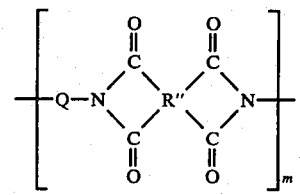

with a polyimide, as required, composed of recurring structural units of the formula:

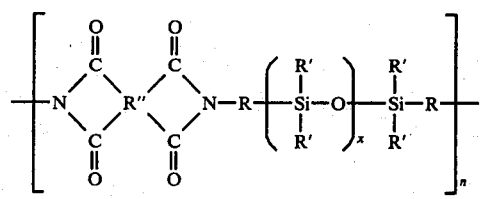

wherein the molar proportion of the latter is from 0 to 50 mol percent
wherein
R is a divalent hydrocarbon radical,
R' is a monovalent hydrocarbon radical,
R" is a tetravalent organic radical,
Q is a divalent silicon-free organic radical which is the residue of an organic diamine,
x is a whole number equal to at least 1 and advantageously from 1 to 8 and as high as 1 to 10,000 or more,
m is an integer greater than 1
n is zero or an integer greater than 0, and
at least one layer of a glass material disposed on the layer of protective coating material.
2. The semiconductor element of claim 1 wherein m is from 10 to 10,000 and n is from 1 to 10,000.
3. The semiconductor element of claim 1 wherein m is 0.
4. The semiconductor element of claim 3 wherein m from 10 to 10,000.

5. The semiconductor element of claim 1 wherein the coefficient of thermal expansion of the glass material approximates the coefficient of thermal expansion of the material of the body.

6. The semiconductor element of claim 5 wherein $n$ is 0.

7. The semiconductor element of claim 5 and including
a second layer of glass comprising silicon dioxide disposed on at least one layer of glass material.

8. The semiconductor element of claim 5 wherein the glass material is one selected from the group consisting of borosilicate glass and phosphosilicate glass.

9. The semiconductor element of claim 8 and including
a second layer of glass comprising silicon dioxide disposed on the at least one layer of glass material.

10. The semiconductor element of claim 8 wherein the thickness of the glass material is from 0.1 micrometer to 10 micrometer.

11. The semiconductor element of claim 10 wherein the thickness of the glass material is 3 micrometers.

12. The semiconductor element of claim 11 and including
a second layer of glass comprising silicon dioxide disposed on the at least one layer of glass material, and
the thickness of the second layer of glass is 2000A.

13. The semiconductor element of claim 12 wherein the semiconductor material is silicon.

14. The semiconductor element of claim 12 wherein the glass material is borosilicate and comprises from 15 to 25 percent mol of $B_2O_3$ therein.

15. The semiconductor element of claim 14 wherein the glass material comprises 19 ± 2 mol percent $B_2O_3$.

16. The semiconductor element of claim 15 wherein the semiconductor material is silicon.

17. The semiconductor element of claim 10 wherein the glass material is borosilicate and comprises from 15 to 25 mol percent of $B_2O_3$ therein.

18. The semiconductor element of claim 17 wherein the semiconductor material is silicon.

19. The semiconductor element of claim 17 wherein $m$ is from 10 to 10,000 and $n$ is from 1 to 10,000.

20. The semiconductor element of claim 17 wherein the glass material comprises 19 ± 2 mol percent $B_2O_3$.

21. The semiconductor element of claim 20 wherein the semiconductor material is silicon.

22. The semiconductor element of claim 10 and including
a second layer of glass comprising silicon dioxide disposed on the at least one layer of glass material, and
the thickness of the second layer of glass is from 1000A to 5000A.

23. The semiconductor element of claim 22 wherein the semiconductor material is silicon.

24. The semiconductor element of claim 22 wherein the glass material is borosilicate and comprises from 15 to 25 mol percent of $B_2O_3$ therein.

25. The semiconductor element of claim 24 wherein the glass material comprises 19 ± 2 mol percent $B_2O_3$.

26. The semiconductor element of claim 25 wherein the semiconductor material is silicon.

* * * * *